(12) United States Patent
Rao et al.

(10) Patent No.: US 11,286,420 B2
(45) Date of Patent: Mar. 29, 2022

(54) PHOTON MULTIPLYING MATERIAL

(71) Applicant: Cambridge Enterprise Limited, Cambridge (GB)

(72) Inventors: Akshay Rao, Cambridge (GB); Nathaniel Davis, Temora (AU); Jesse Allardice, Cambridge (GB)

(73) Assignee: Cambridge Enterprise Limited, Cambridge (GB)

( * ) Notice: Subject to any disclaimer, the term of this patent is extended or adjusted under 35 U.S.C. 154(b) by 0 days.

(21) Appl. No.: 16/767,779

(22) PCT Filed: Dec. 3, 2018

(86) PCT No.: PCT/GB2018/053501
§ 371 (c)(1),
(2) Date: May 28, 2020

(87) PCT Pub. No.: WO2019/110971
PCT Pub. Date: Jun. 13, 2019

(65) Prior Publication Data
US 2020/0362234 A1    Nov. 19, 2020

(30) Foreign Application Priority Data
Dec. 4, 2017 (GB) ...................................... 1720190

(51) Int. Cl.
*C09K 11/02* (2006.01)
*C09K 11/08* (2006.01)
(Continued)

(52) U.S. Cl.
CPC ............ *C09K 11/025* (2013.01); *C09K 11/06* (2013.01); *C09K 11/0811* (2013.01);
(Continued)

(58) Field of Classification Search
CPC ... C09K 11/025; C09K 11/06; C09K 11/0811; C09K 11/661; C09K 2211/18;
(Continued)

(56) References Cited

U.S. PATENT DOCUMENTS

2016/0238455 A1*    8/2016 Congreve ............ C09K 11/661

FOREIGN PATENT DOCUMENTS

| KR | 20160057641 | 5/2016 |
| KR | 20160057642 | 5/2016 |
| WO | 2016009203 | 1/2016 |

OTHER PUBLICATIONS

Garakyarashi, S. et al., "Delayed Molecular Triplet Generation from Energized Lead Sulfide Quantum Dots", ACS (2017) pp. 1458-1463.
(Continued)

*Primary Examiner* — C Melissa Koslow
(74) *Attorney, Agent, or Firm* — Hartman Global IP Law; Gary M. Hartman; Domenica N. S. Hartman

(57) ABSTRACT

A photon multiplying material containing a luminescent material having organic semiconductor molecules capable of singlet fission attached thereto, wherein the organic semiconductor molecules are chemically attached to the luminescent material by a linking group and wherein the linking group and the band gap of the luminescent material are selected so that exciton triplet states formed by singlet fission in the attached organic semiconductor molecules can be energy transferred into the luminescent material.

20 Claims, 5 Drawing Sheets

(51) Int. Cl.
  *C09K 11/66* (2006.01)
  *H01L 51/00* (2006.01)
  *C09K 11/06* (2006.01)
  *B82Y 20/00* (2011.01)
  *B82Y 30/00* (2011.01)
  *B82Y 40/00* (2011.01)

(52) U.S. Cl.
  CPC ........ *C09K 11/661* (2013.01); *H01L 51/0054* (2013.01); *H01L 51/0094* (2013.01); *B82Y 20/00* (2013.01); *B82Y 30/00* (2013.01); *B82Y 40/00* (2013.01); *C09K 2211/1441* (2013.01); *C09K 2211/18* (2013.01)

(58) Field of Classification Search
  CPC . C09K 2211/1441; B82Y 20/00; B82Y 30/00; B82Y 40/00; H01L 51/0054; H01L 51/0094
  See application file for complete search history.

(56) References Cited

OTHER PUBLICATIONS

Zhiyuan, H. et al., "PbS/CdS Core-Shell Quantaum Dots Suppress Charge Transfer and Enhance Triplet Transfer", Angew. Chem. Int. Ed. (2017), 56, pp. 16583-16587.

Combined Search and Examination Report Under Sections 17 and 18(3) for International Application No. GB1720190.6, dated Jun. 29, 2018, (5) pages.

International Search Report and Written Opinion for International Application No. PCT/GB2018/053501, dated Feb. 14, 2019, (16 pages).

* cited by examiner

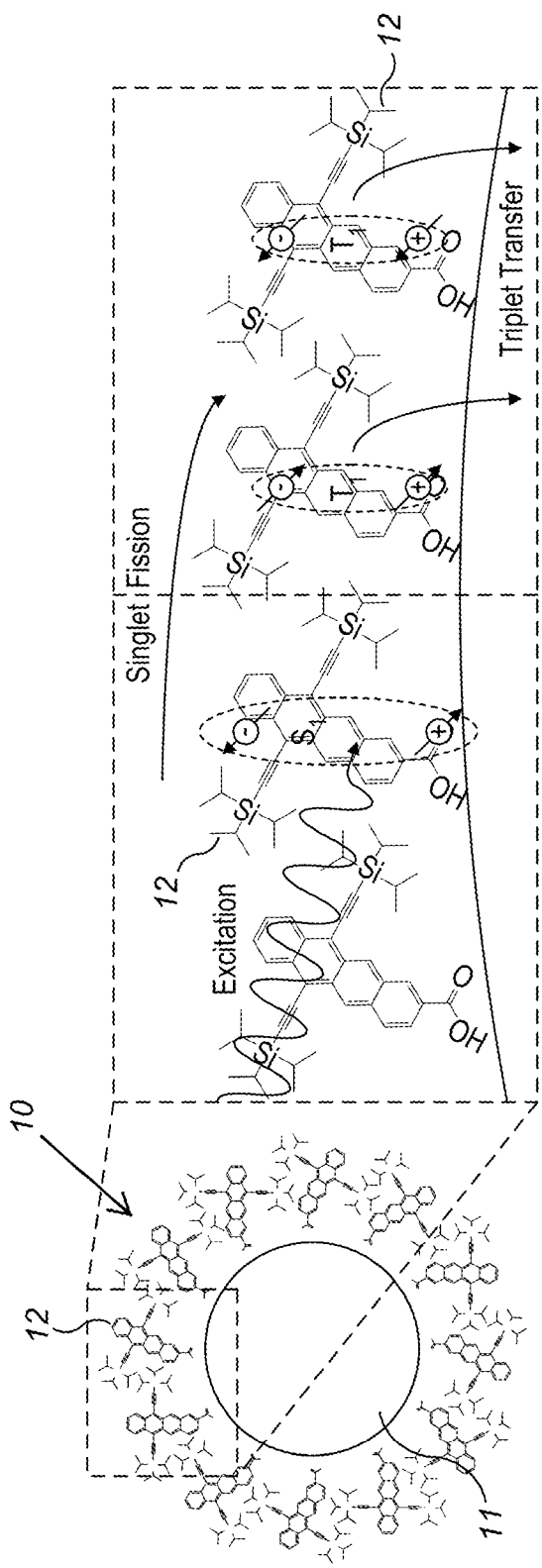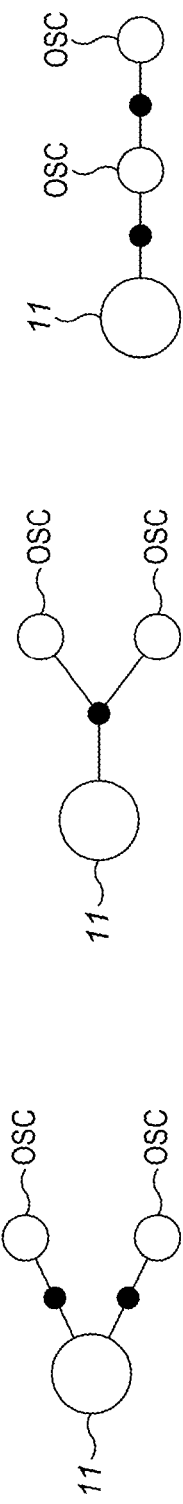
FIG. 1
FIG. 2a
FIG. 2b
FIG. 2c

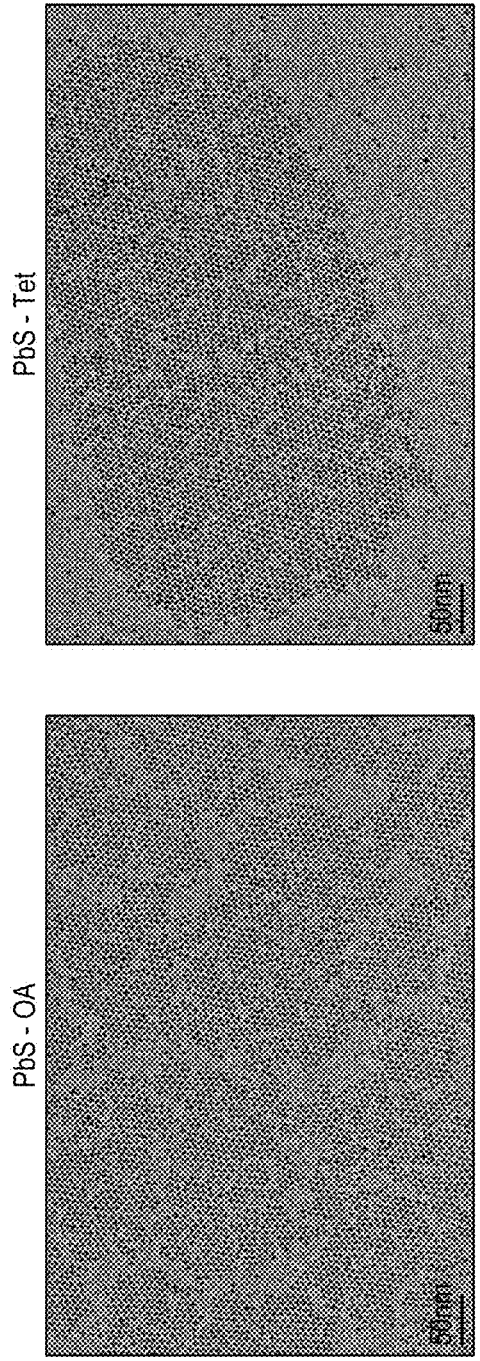
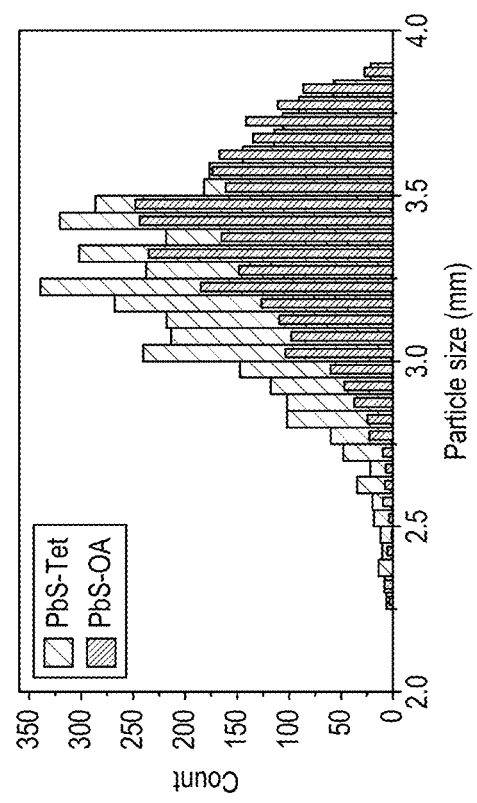
FIG. 3a
FIG. 3b

PHOTON MULTIPLYING MATERIAL

CROSS REFERENCE TO RELATED APPLICATIONS

This application claims priority to International Patent Application No. PCT/GB2018/053501, filed Dec. 3, 2018, which claims the benefits of GB 17 20190.6 filed Dec. 4, 2017. The contents of these prior patent documents are incorporated herein by reference.

BACKGROUND OF THE INVENTION

The present invention is concerned with a photon multiplying material and a photon multiplying film containing the material—as well as with an opto-electronic device, such as a solar or photovoltaic cell, containing the film.

Low band-gap solar cells like mono- and poly-crystalline silicon represent more than 90% of the global solar photovoltaics market. The highest efficiency (26.3%) using monocrystalline silicon is close to the theoretical limit of 29.4%. Improvements aimed at reducing optical loss and charge recombination are difficult and costly to obtain.

Accordingly, much recent work is directed to approaches which can exceed the theoretical limit. These approaches may be categorised as single junction solar cells with carrier multiplication (maximum theoretical efficiency about 39%), tandem solar cells wherein different combinations of materials are provided with and without carrier multiplication (theoretical efficiency in the range of 39-47%) and spectral (up and down) conversion with or without photon multiplication.

The use of singlet fission materials (for example, organic semiconductors) in photovoltaics has been actively researched since around 2006 because of its potential to produce twice the photons or charges within a spectral range.

Singlet fission in organic semiconductors is a spin-allowed process in which a singlet exciton ($S_1$) formed upon light absorption is converted to two triplet excitons ($T_1$).

For singlet fission to occur, the triplet exciton level must be close to half of the energy of the singlet exciton, e.g. $S_1 \cong 2*T_1$. For monocrystalline silicon (band gap $E_g$ of 1.1 eV), singlet fission materials need to have a $S_1$ level of 2.3-2.6 eV (blue-green light absorption) and a $T_1$ level of 1.2-1.3 eV.

Note that singlet fission can be classified as either endothermic or exothermic. In exothermic fission, the energy of the lowest singlet exciton ($S_1$) is greater than twice the lowest triplet energy ($T_1$), i.e. $S_1 > 2T_1$. In endothermic fission, the energy of the lowest singlet exciton ($S_1$) is less than twice the lowest triplet energy ($T_1$), i.e. $S_1 < 2T_1$. In this case, the singlet exciton is initially converted to a correlated triplet pair state (TT state) whose energy is close to that of the singlet exciton. The TT state then breaks up via thermal activation into free triplet excitons ($T_1$).

WO 2014/001817 A1 discloses a solar cell in which an organic semiconductor layer capable of multiple exciton generation is provided on an inorganic semiconductor layer.

Photovoltaic efficiency enhancement via singlet fission spectral conversion has also been investigated in solar cells. The purely optical coupling between a photon multiplier film and an underlying low band gap solar cell is advantageous because it puts fewer requirements on the singlet fission material functionality, for example, no requirement to generate and conduct current. In addition, the photon multiplier film can be developed independently of the well-optimised commercial cell production.

WO 2014/052530 A1 discloses a singlet fission photon multiplier film which is used as an organic sensitizing window layer deposited over a silicon cell. The organic sensitizing window layer consists of a singlet fission host material containing a phosphorescent emitter dopant, where the singlet fission host material has a triplet energy greater than or equal to the triplet energy of the phosphorescent emitter dopant. A singlet produced upon the absorption of one high energy photon by the singlet fission host undergoes fission into two triplets and each triplet is transferred to a separate phosphorescent emitter dopant. The process results in two near infrared photons being emitted from the phosphorescent emitter dopant which are subsequently absorbed into the adjacent silicon cell, producing two electron-hole pairs.

US 2014/0224329 A1 and WO 2016/009203 A1 each disclose a photon multiplier film having bi-layers comprising an acene and/or a lead chalcogenide quantum dot.

In these films, the non-emissive triplet excitons are transferred into the infrared emissive quantum dot by Dexter energy transfer which relies on orbital overlap between the excitation donor and the excitation acceptor.

Whilst the injection of the triplet excitons in these systems may be expected to occur efficiently only on very short length scales (<1 nm), there has been no disclosure of directly coupling the quantum dot with an organic semiconductor molecule for photon multiplication.

However, the direct coupling of a quantum dot with an organic semiconductor molecule for photon up-conversion is known (see for example, Mahboub et al., in Nanoletters, 2016, 16, 7169-7175).

BRIEF DESCRIPTION OF THE INVENTION

The present inventors ascribe this situation to a prejudice within the art which holds that singlet fission in ligands attached to a quantum dot is unlikely to form triplet excitons in neighbouring ligands which can transfer sequentially into the quantum dot and recombine so that two photons may be emitted from the quantum dot for each photon absorbed by the ligands.

The present inventors have found that photon multiplication by singlet fission in ligands attached to a quantum dot can occur with energy transfer of triplet excitons into the quantum dot.

Accordingly, in a first aspect, the present invention provides a photon multiplying material comprising a luminescent material having organic semiconductor molecules capable of singlet fission attached thereto, wherein the organic semiconductor molecules are chemically attached to the luminescent material by a linking group and wherein the linking group and the band gap of the luminescent material are selected so that exciton triplet states formed by singlet fission in the attached organic semiconductor molecules can be energy transferred into the luminescent material.

Note that an adequate singlet fission and transfer of triplet states into a luminescent material cannot be expected from the known photon up-conversion systems in which a quantum dot is directly coupled with an organic semiconductor molecule.

In the case of up-conversion, the quantum dot is excited by the photon and an exciton is transferred from the quantum dot to the triplet level of the ligand. Only one triplet is transferred and no interaction between the ligands occurs because the triplet on the ligand is transferred onto a molecule which is unattached to the quantum dot.

Further, the generation of triplets via singlet fission in organic semiconductor molecules attached to the surface of a luminescent material is surprising because it cannot be assumed that the ligands will adopt a mutual orientation which is favourable for singlet fission. The singlet fission process is known to be highly sensitive to molecular configuration—especially in the case of endothermic fission.

In addition, an endothermic fission in such ligands is unexpected because the rate of singlet fission (picoseconds) in endothermic systems is generally slower than the rate of energy transfer (such as Forster resonant energy transfer, FRET) of the singlet exciton to the luminescent material (sub-picosecond).

The sequential transfer of both triplet states, rather than a single triplet state is also surprising because following the injection of the first triplet state, the second triplet state must remain on its ligand for several microseconds whilst the first triplet state recombines within the quantum dot. Such a delay might be expected to result in significant non-radiative recombination and/or decay by quenching of the second triplet state.

Note that the linking group should provide that one or more of the attached organic semiconductor molecules are within 2.0 nm or less, preferably 1.0 nm or less, and more preferably 0.5 nm or less of the quantum dot.

Note further that for singlet fission to occur, the attachment of organic semiconductor molecules to the luminescent material should provide that, at least some of, the neighbouring semiconductor molecules are within 2.0 nm or less, preferably 1.0 nm or less, and more preferably 0.5 nm or less of each other.

In one embodiment, the linking group attaches a single organic semiconductor molecule so that neighbouring semiconductor molecules are within 2.0 nm or less, preferably 1.0 nm or less, and more preferably 0.5 nm or less of each other.

In another embodiment, the linking group attaches two semiconductor molecules so that each semiconductor molecule is within 2.0 nm or less, preferably 1.0 nm or less, and more preferably 0.5 nm or less of the other.

In still another embodiment, the linking group attaches a semiconductor molecule which is itself attached to a second semiconductor molecule by a further linking group. In that case, the further linking group need only have a length providing that an exciton triplet state can be transferred from the semiconductor moiety furthest from the luminescent material to the semiconductor moiety nearest the luminescent material.

The organic semiconductor molecules may be one or more of a small molecule, a dimer, an oligomer, a homopolymer, a copolymer, a dendrimer or an organometallic complex.

In some embodiments, therefore, the organic semiconductor molecules comprise one or more of an acene, a perylene, a rylene, a diketopyrrolopyrrole, a fluorene, a carotenoid, or a benzofuran.

In a preferred embodiment, the organic semiconductor molecules comprise an acene, especially a substituted acene, such as a substituted triacene, tetracene and pentacene.

In this embodiment, the linking group may attach the acene to the luminescent material at a position (for example the 2-position) providing that the semiconductor moiety extends substantially away from the luminescent material.

In preferred embodiments, the semiconductor molecules have a (energy) bandgap in the range 1.4 to 4.0 eV, preferably 2.0 to 3.0 eV and more preferably 2.3 to 2.6 eV.

The linking group (as well as the further linking group) may, for example, comprise one or more a carboxyl ($-CO_2-$), thiocarboxyl ($-CSO-$ or $-COS-$), amido ($-NHO-$ or $-NRO-$), amidino ($-NHN-$ or $-NRN-$), thiocarbamyl ($-CSN-$), sulphanyl ($-S-$) and phosphatidyl ($-PO_3-$) moiety. It may also include a degree of rigidity or unsaturation in for example, acetylene, alkene, thiophene, furan, pyrrole, p-phenylene or oligo(p-phenylene), p-phenylene ethynylene and p-phenylenevinylene moieties.

However, the size and nature of the linking group should provide the degree of flexibility on the luminescent material that is necessary for singlet fission between neighbouring semiconductor moieties.

In one embodiment, the organic semiconductor molecules are comprised by 6,11-bis-((triisopropylsilyl)ethynyl)tetracene-2-carboxylic acid or a salt (for example, a sodium or potassium salt) thereof.

The luminescent material may be an organic or an inorganic material to which exciton triplet states can be sequentially transferred from the attached semiconductor molecules and recombined so that two photons are emitted from the quantum dot for each photon absorbed by the ligands.

It may comprise an organic transition metal phosphorescent compound, a thermally delayed fluorescent organic compound, an inorganic semiconductor nanoparticle, a 2D-semiconductor or a perovskite material.

Preferably, the luminescent material is a colloidal semiconductor nanocrystal such as a quantum dot. The quantum dot may comprise a core-shell structure in which one or more shells of an inorganic semiconducting material are present.

The core-shell structure may comprise one or more of CdSe, CdS, ZnTe, ZnSe, PbS, PbSe, PbTe, HgS, HgSe, HgTe, HgCdTe, CdTe, copper zinc tin sulfide (CZTS), ZnS, $CuInS_2$, alloys of copper indium selenium and sulfur (CISS), $CuGaS_2$, $AgInSe_2$, CuInGaSe, CuInGaS, silicon, InAs, InP, InSb, $SnS_2$, CuS, germanium, and $Fe_2S_3$.

The nanocrystal may have a diameter of 50 nm or less, preferably 20 nm or less, preferably 10 nm or less, and more preferably 5 nm or less.

In some embodiments, the (energy) band gap of the luminescent material is in the range of 0.5 eV to 2.0 eV or 0.6 eV to 2.0 eV, preferably 0.8 eV to 1.7 eV, more preferably 0.9 eV to 1.4 eV.

Note in this regard, that the bandgap of quantum dots may be tuned by control of the size (diameter) of the quantum dot as it is prepared (see, for example, Hines, M. A. and Scholes, G. D., in Advanced Materials, 2003, 15 (21), 1844-1349).

Note also that the energy of the exciton triplet state of the organic semiconductor molecules should be greater than the bandgap of the luminescent material. Preferably, it is within 0.4 eV of the band gap of the luminescent material, more preferably, within 0.3 eV, and most preferably within 0.2 eV.

Note further that the quantum dots may have ligands other than those of the linking group and semiconductor molecules. These ligands originate with the production of the quantum dots and are used to passivate the surface of the quantum dot. They may, for example, comprise long chain hydrocarbons originate from carboxylic acids, such as oleic acid.

These ligands may advantageously fill gaps on the surface of the quantum dot which arise on account on the relative bulk of the semiconductor molecules.

The photon multiplying material may be excited (whereby to produce photon multiplication) by illumination with light of wavelength(s) between 300 nm and 600 nm.

In a second aspect, the present invention provides a photon multiplying film comprising the photon multiplying material according to the first aspect.

The film may be a continuous film or a matrix film comprising a dispersion of the photon multiplying material. The material of the film may be chosen from a wide variety of polymers and their derivatives. Suitable polymers include, but are not limited to, polybutyrals, polyvinylbutyrals, polysiloxanes, polyamides, polyurethanes, polythiols, polyesters, polycrylates, epoxies, polycarbonates, polyolefins, ethyl vinyl acetates, silicones, carbohydrates, proteins, nucleic acids and lipids.

Embodiments in the second aspect will be apparent from the foregoing description.

In a third aspect, the present invention provides an opto-electronic device comprising the photon multiplying film of the second aspect.

The photon multiplying film may be in optical communication with an opto-electronic element such as a solar cell, a photodetector, a light-emitting diode, a field-effect transistor, a display, a sensor or a biological imaging device.

Embodiments in the third aspect will be apparent from the foregoing description.

In a fourth aspect, the present invention provides for the use of a material comprising a luminescent material having organic semiconductor molecules capable of singlet fission attached thereto, wherein the organic semiconductor molecules are chemically attached to the luminescent material by a linking group and wherein the linking group and the band gap of the luminescent material are selected so that exciton triplet states formed by singlet fission in the attached organic semiconductor molecules can be energy transferred into the luminescent material, as a photon multiplying material.

Embodiments in the fourth aspect will be apparent from the foregoing description.

In a fifth aspect, the present invention provides for the use of a film comprising a material comprising a luminescent material having organic semiconductor molecules capable of singlet fission attached thereto, wherein the organic semiconductor molecules are chemically attached to the luminescent material by a linking group and wherein the linking group and the band gap of the luminescent material are selected so that exciton triplet states formed by singlet fission in the attached organic semiconductor molecules can be energy transferred into the luminescent material, as a photon multiplying film.

Embodiments in the fifth aspect will be apparent from the foregoing description.

In a sixth aspect, the present invention provides a method for photon multiplication, the method comprising providing a material comprising a luminescent material having organic semiconductor molecules capable of singlet fission attached thereto, wherein the organic semiconductor molecules are chemically attached to the luminescent material by a linking group and wherein the linking group and the band gap of the luminescent material are selected so that exciton triplet states formed by singlet fission in the attached organic semiconductor molecules can be energy transferred into the luminescent material and illuminating that material with light of wavelength(s) exciting the singlet fission and the transfer.

Embodiments in the sixth aspect will be apparent from the foregoing description. The exciton triplet states transferred into the luminescent material produces an emission of light the luminescent material. The wavelength(s) of the illuminating light may range from 300 nm to 600 nm. The material may be provided with a film (for example, within an opto-electronic device) as described above.

BRIEF DESCRIPTION OF THE DRAWINGS

The present invention will now be described in more detail by way of example only and having regard to the following examples and the accompanying drawings in which:

FIG. 1 is a scheme illustrating photon multiplication by one embodiment of the photon multiplying material of the present invention;

FIG. 2 (a) to (c) are schematic illustrations of embodiments of the photon multiplying material of the present invention;

FIG. 3 shows (a) photographs of nanocrystals of the embodiment of FIG. 1 and a quantum dot comprising only ligands derived from oleic acid and (b) a graph showing their respective size distribution;

DETAILED DESCRIPTION OF THE INVENTION

Figure 4A:
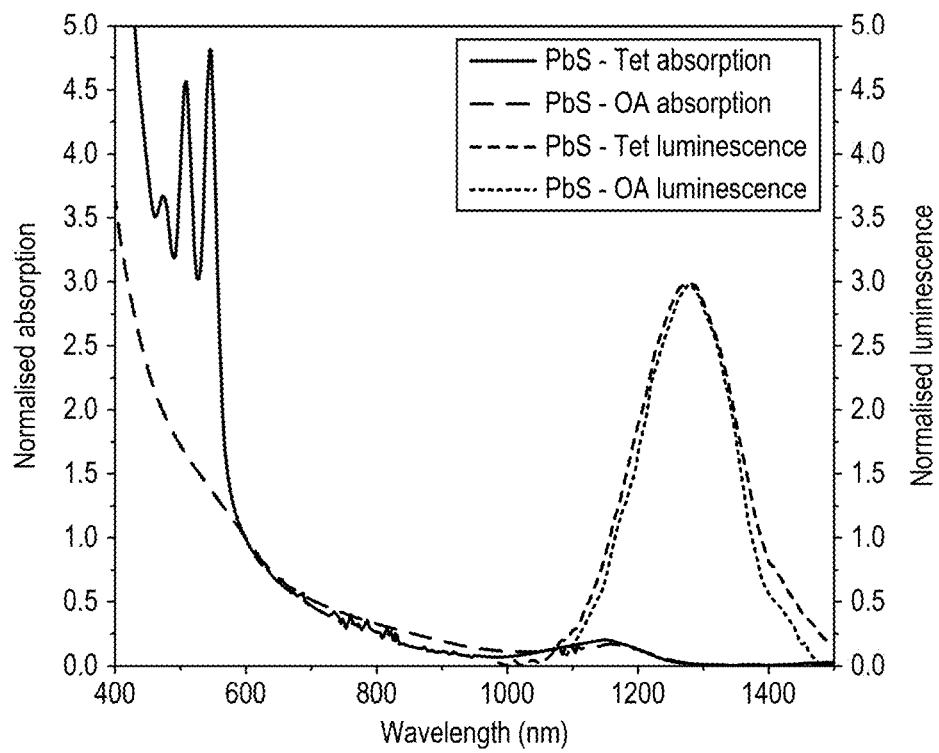
FIG. 4 shows graphs showing (a) the optical absorption and photoluminescence spectra of the embodiment of FIG. 1 as compared to the optical absorption and photoluminescence spectra of the quantum dot comprising only ligands derived from oleic acid and (b) the optical absorption and excitation spectrum of the embodiment of FIG. 1.

Referring now to FIG. 1, a photon multiplying material, generally designated 10, according to one embodiment of the present invention comprises a luminescent quantum dot having a lead sulphide (PbS) core structure (11) and outer surface to which a coating (12) comprising ligands derived from 6,11-bis-((triisopropylsilyl)ethynyl)-tetracene-2-carboxylic acid (hereinafter "TIPS-Tet-CA") is adhered.

The photon multiplying material comprises, therefore, a luminescent material to which an organic semiconductor molecule, capable of singlet fission is chemically attached by a carboxyl (—$CO_2$—) linking group.

The chemical attachment may be through covalent bonding of the carboxylic acid with the surface of the luminescent material.

Illumination of the material at a selected wavelength of light excites a singlet state $S^1$ of excitons in the tetracene moiety of the coating (12) which decays by singlet fission to two triplet states $T_1$ of lower energy.

The triplet states $T_1$, which are on adjacent semiconductor moieties are energy transferred into the core structure (11)—sequentially and with the result that the core structure (11) luminesces with up to twice the photoluminescence quantum efficiency than if it had been excited directly.

The injection of both triplet states $T_1$, rather than just one triplet state $T_1$, from the TIPS-Tet moiety into the core structure (11) is surprising because following the injection of the first triplet state, the second triplet state must remain on the TIPS-Tet moiety for several microseconds whilst the first triplet state recombines within the core structure to produce a photon. The delay for the injection of the second triplet state would be expected to lead to significant non-radiative recombination or decay of the second triplet by quenching.

Referring now to FIG. 2, alternative embodiments of the present invention differ in their relative arrangement on the core shell structure.

In one embodiment (a), also shown in FIG. 1, the linking group (here indicated as •) permits attachment of one organic semiconductor moiety (OSC) in sufficient proximity to the core structure (11).

In another embodiment (b), the linking group permits attachment of two organic semiconductor moieties in sufficient proximity to the core structure and each other.

In a further embodiment c), the organic semiconductor molecule includes two organic semiconductor moieties (OSC) which are connected by a further linking group (also indicated as •) so that the nearer organic semiconductor moiety is sufficiently close to the core structure (11) and the further organic semiconductor moiety is sufficiently close to the nearer for energy transfer of the triplet state formed therein.

Note that the organic semiconductor molecules (OSC) may be the same and that the linking group and the further linking group may be the same or different.

Example—A Photon Multiplying Quantum Dot

Preparation of A Passivated Quantum Dot

Passivated lead sulphide quantum dots were synthesised according to a modification of the literature method of Hines, M. A. and Scholes, G. D., in Advanced Materials, 2003, 15(21), 1844-1949.

Lead oxide (PbO, 0.62 g, 2.8 mmol), oleic acid (8 ml, 22.4 mmol, 7.2 g and octadecene (25.0 ml, 76.3 mmol, 19.5 g) were stirred together in a three-neck reaction flask and degassed at 110° C. under vacuum ($10^{-7}$ mbar or better).

After two (2) hours, the reaction flask was flushed with nitrogen and the solution heated to 115° C. A solution of bis(trimethylsilyl)sulphide (TMS, $(Me_3Si)$, 286 μl, 1.4 mmol) in octadecene ($C_{18}H_{36}$, 13.9 ml, 42.4 mmol, 10.8 g) was rapidly added to the flask and the reaction immediately quenched by placing the reaction flask in an ice-water bath.

Lead sulphide (PbS) quantum dots passivated by hydrocarbon ligand from oleic acid (OA) were isolated from the reaction mixture by flocculating to turbidity with hexane as solvent and a mixture of 1-butanol/ethanol/acetone as the anti-solvent.

After purification, the passivated (PbS-OA) quantum dots were washed and re-dispersed in octane or toluene at a concentration of about 10 mg to 100 mg per ml. The dispersion was stored under an atmosphere of argon or nitrogen at standard temperature and pressure.

Note that the (energy) bandgap of the passivated quantum dots could be tuned by adjustment of the oleic acid (OA) concentration in the reaction mixture or by adjustment of the temperature of: the reaction.

Preparation of the Photon Multiplying Quantum Dot

A ligand exchange reaction was performed on the passivated quantum dots (PbS-OA) according to the procedure of Garakyaraghi, S. et al., in Journal of Physical Chemistry Letters, 2017, 8(7), 1458-1463, using 6,11-bis-((triisopropylsilyl)ethynyl)tetracene-2-carboxylic acid (TIPS-Tet-CA) for the new ligand.

To a stirred solution of the passivated quantum dots (20 mg) solution in toluene (1 ml) was added TIPS-Tet-CA (in excess). The resulting solution was stirred in the dark for 16 hours and acetone added to precipitate the PbS/TIPS-Tet-CA quantum dots (hereinafter the Tet-CA-1 quantum dots).

In another experiment, the sodium salt of TIPS-Tet-CA was added to a solution of the passivated quantum dots (20 mg) in a mixture of toluene and tetrahydrofuran (THF). The resulting solution was stirred in the dark for 16 hours and acetone added to precipitate the PbS/TIPS-Tet-CA quantum dots (hereinafter the Tet-CA-2 quantum dots).

The PbS/TIPS-Tet-CA quantum dots were collected by centrifugation at 4000 rpm for 5 minutes and (following removal of the supernatant) dispersed in toluene (1 mL).

These quantum dots were purified by repeating (for example, six times or more) the precipitation, dispersal and centrifugation steps until no free TIPS-Tet-CA was detectable in the solution. Finally, the PbS/TIPS-Tet-CA quantum dots were dispersed in toluene (1 mL), and stored under nitrogen in the dark at −20° C.

Characterisation of the Photon Multiplying Quantum Dot

The Tet-CA-1 quantum dots were compared with the PbS/OA quantum dots under electron microscopy. TEM samples were prepared by drop casting the stored toluene solution on a TEM Grid (200 Mesh Cu, Agar Scientific) in an argon- or nitrogen-filled glove box and imaged employing a FEI Tecnai F20 microscope operated at 200 kV.

FIG. 3 (*a*) shows micrographs of a prepared film of PbS/OA quantum dots (left hand side) and of PbS/TIPS-Tet-CA quantum dot (right hand side).

FIG. 3 (*b*) shows the size distribution of the Tet-CA-1 quantum dots as compared to the PbS/OA quantum dots.

The nanocrystal size distributions were measured using the software package ImageJ (https://imagej.nih.gov/ij/). Briefly a contrast threshold was chosen which solely included the nanocrystal particles and not the image background. Using the analyze particle function, which counts areas of contrast above the threshold, particle size was limited to a designated maximum which excluded overlaid nanocrystals and the total number of nanocrystals and their size were measured.

As may be seen from FIG. 3, the Tet-CA-1 quantum dots are structurally similar to the PbS/OA quantum dots.

Photon Multiplication of the Photon Multiplying Quantum Dot

The photoluminescence of toluene solutions of PbS/OA and Tet-CA-1 quantum dots and Tet-CA-2 quantum dots was examined in an integrating sphere at excitation wavelengths of 520 nm, 532 nm and 785 nm with continuous-wave lasers. The laser and the emission signals were measured and quantified using a calibrated Andor iDus DU490A InGaAs detector.

Figure 4B:
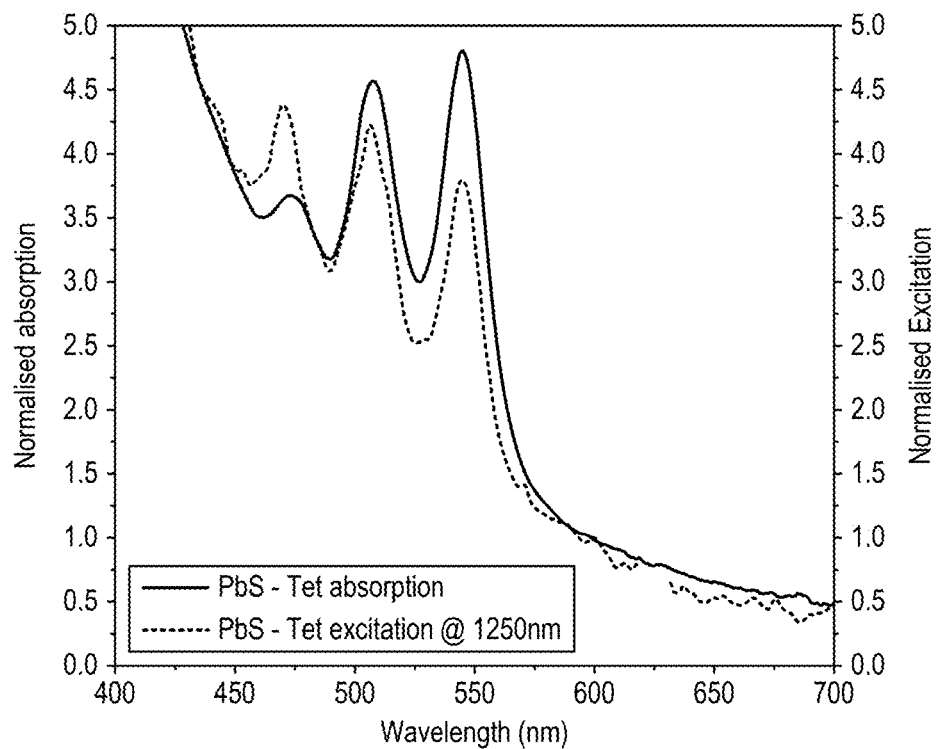

Referring now to FIG. 4 (*a*) the photoluminescence spectrum for the passivated quantum dots shows a strong absorption excitonic feature at around 1150 nm with absorption extending into the blue and peak photoluminescence at about 1275 nm.

The photoluminescence spectrum for the Tet-CA-1 quantum dots shows similar absorption although there is an added absorption corresponding to TIPS-Tet-CA ligand. Note, however, the photoluminescence quantum efficiency, calculated as per de Mello, J., et al, in Advanced Materials 1997, 9(3), 230-232, decreases from 35.2% to 8.9% when the excitation wavelength is 785 nm following the ligand exchange from the native oleic acid ligands to TIPS-Tet-CA ligands.

Referring now to FIG. 4 (*b*) the excitation spectrum at an excitation wavelength of 1250 nm for the Tet-CA-1 quantum dots shows a clear contribution from TIPS-Tet-CA absorption.

Note that the absorption is shown in a log scale and that the emission results mostly from the quantum dot.

Figure 5A:
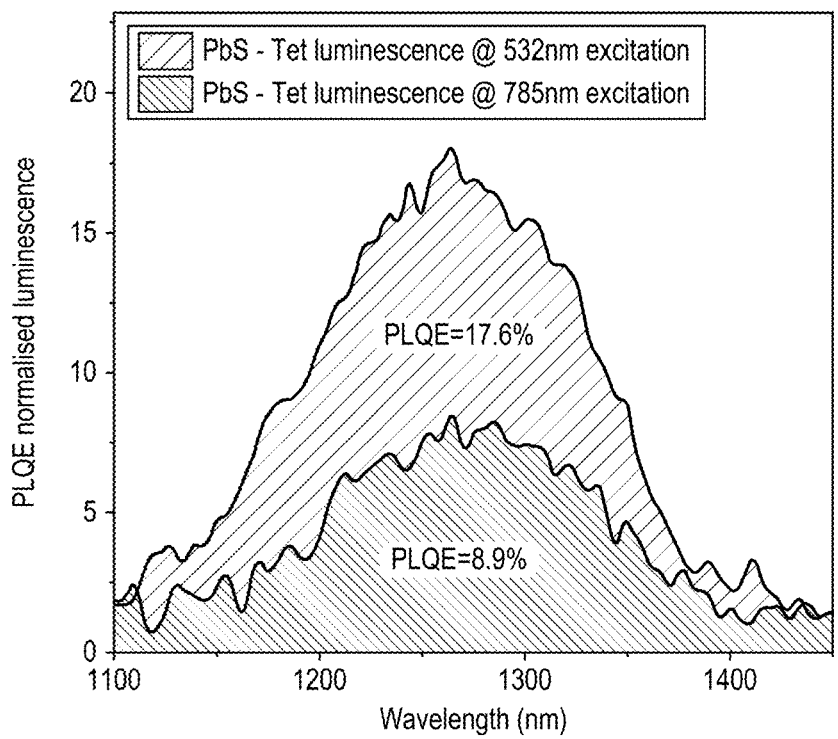
FIG. 5 shows graphs showing (a) the photoluminescence spectra and photoluminescence quantum efficiency values of the embodiment of FIG. 1 on illumination with light of 532 nm and 785 nm wavelength and (b) transient photoluminescence of the embodiment of FIG. 1 on excitation at 530 nm and 650 nm.
Figure 5B:
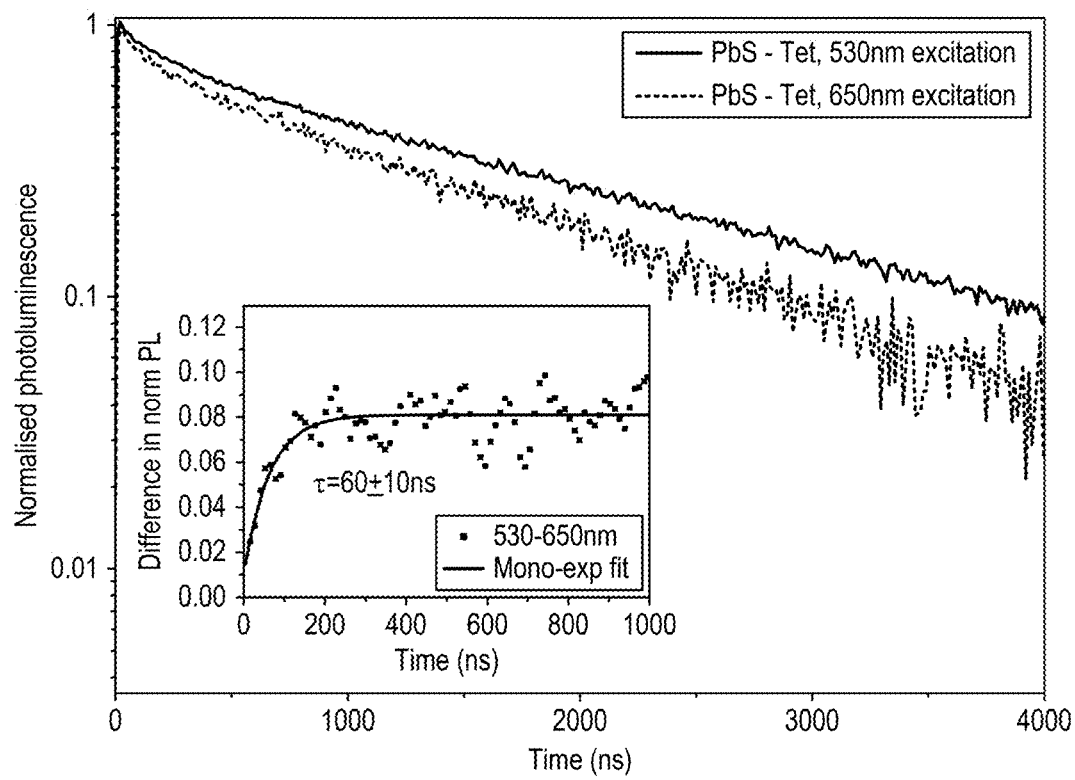

Referring now to FIG. 5 (*a*) the photoluminescence quantum efficiency of the Tet-CA-1 quantum dots on excitation of both the tetracene moiety and quantum dot (532 nm) was found to be 17.6%. The photoluminescence quantum efficiency on excitation of the quantum dot alone (785 nm) was found to be 8.9%.

The increase of the photoluminescence quantum efficiency demonstrates that singlet fission occurs in the TIPS-Tet-CA ligand and that additional photons are emitted from the quantum dot as compared to those absorbed by the ligand.

Note that the fluence of the photoluminescence was kept low so as to reduce the probability of the absorption of more than one photon per quantum dot during excitation.

Referring now to FIG. 5 (*b*), the photoluminescent lifetime of Tet-CA-1 quantum dots was found to be 1.4 µs when the quantum dots were excited (at 650 nm, viz., outside the absorption range of the TIP-Tet-CA ligand) as compared to 1.8 µs when the TIPS-Tet-CA ligand was excited at 530 nm.

This increased photoluminescent lifetime is consistent with the generation of long-lived triplet excitons in the TIPS-Tet-CA ligand and a transfer to the PbS quantum dot resulting in emission. It agrees with results reported for a PbSe quantum dot/pentacene bilayer by Tabachnyk, M. et al., in Nature Materials, 2014, 13, 1033 to 1038.

Figure 6:
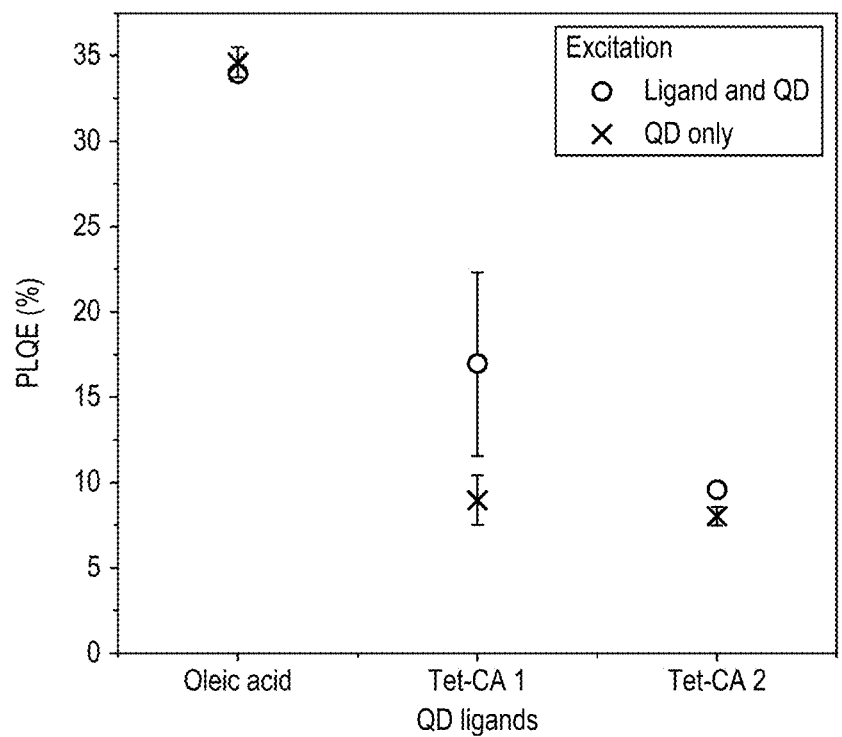
FIG. 6 shows a comparison of photoluminescence quantum efficiency values of an embodiment of FIG. 1 on illumination with i) light of wavelength 532 nm (o) and light of wavelength 785 nm (x) and ii) light of wavelength 520 nm (o) and light of wavelength 658 nm (x) wherein the shorter (blue-green) wavelengths excite both the ligand and the quantum dot and the longer (red) wavelengths excite only the quantum dot.

Referring now to FIG. 6, the photoluminescence quantum efficiency of the passivated quantum dots, Tet-CA-1 and Tet-CA-2 quantum dots is compared at different excitation wavelengths.

The photoluminescence quantum efficiency of the passivated quantum dots (here used as a control and labelled "Oleic Acid") does not change within experimental error when they are illuminated with light of wavelength 520 nm (•) as compared to when they are illuminated with light of wavelength 658 nm (x).

In the cases of both the Tet-CA-1 quantum dots and Tet-CA-2 quantum dots, an increase in photoluminescence quantum efficiency is seen when they are illuminated with light of wavelength that is absorbed by the TIPS-Tet-CA ligand (o; 532 nm for Tet-CA-1 and 520 nm for Tet-CA-2) as compared to when they are illuminated with light that is not absorbed by the TIPS-Tet-CA ligand (x, 785 nm for Tet-CA-1 and 658 nm for Tet-CA-2).

For the Tet-CA-2 quantum dots the photoluminescence quantum efficiency is 9.6%+/−0.5% at 520 nm and 8%+/−0.5% at 658 nm.

Note that the difference between the photoluminescent quantum efficiencies of the Tet-CA-1 and Tet-CA-2 quantum dots reflects a dependence on the excitation wavelength.

Note also that in this Figure, an apparent instability in the power output of the 532 nm laser is reflected in possible experimental error (+/−5%, see bars) in the photoluminescence quantum efficiency of the Tet-CA-1 quantum dots on excitation at that wavelength. The power output of the 520 nm laser was by contrast much more stable and the possible experimental error in the photoluminescence quantum efficiency of the Tet-CA-2 quantum dots is significantly lower on excitation at that wavelength.

Figure 7:
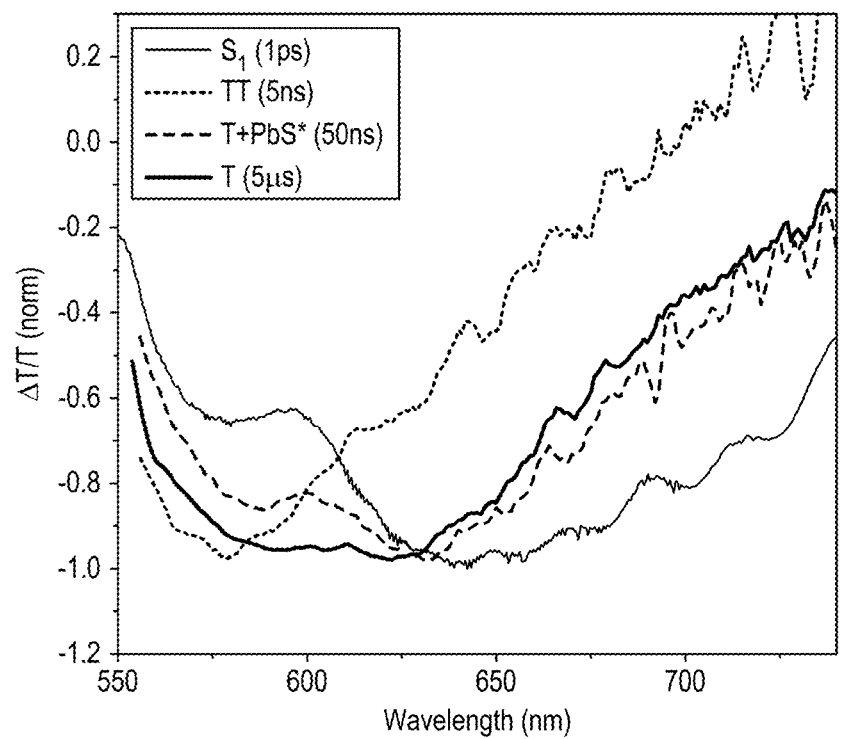
FIG. 7 shows a graph showing the transient absorption spectra of the embodiment of FIG. 1.

Referring now to FIG. 7, the transient optical absorption spectrum of Tet-CA-1 quantum dots after photoexcitation shows at early times (1 ps) the singlet like features of TIPS-Tet-CA superimposed on top of a broad photoinduced absorption feature from the PbS core structure.

At later times (5 ns) a spectral feature characteristic of a triplet-triplet pair state for TIPS-Tet-CA is seen—demonstrating efficient conversion of the singlet exciton state on TIPS-Tet-CA to a pair of triplet states via singlet fission.

At 50 ns, the spectral features are consistent with a triplet on the TIPS-Tet-CA ligand as well as with excitations on the PbS core structure—indicating that the triplets from the triplet-triplet pair state have been injected into the PbS core structure.

At longer times (5 us), the triplet exciton of the TIPS-Tet-CA is still seen.

These experimental results show that when the chemically attached organic semiconductor molecule is excited, the excitations undergo singlet fission and the resulting triplet excitons are transferred into the quantum dots.

The transfer, which leads to an increase in the observed photoluminescence quantum efficiency, is confirmed by the transient photoluminescence and transient absorption studies.

The present invention provides, therefore, a photon multiplying material which can be excited at wavelengths of light between 300 nm to 600 nm and has the advantage of:

intimate contact of a singlet fission molecule with a quantum dot; and may provide highly efficient injection of triplets into the quantum dot (as evidenced by increase in photoluminescence quantum efficiency);

remove the need for a specific arrangement of singlet fission molecules to ensure efficient fission. It is possible that the ligands are flexible on the surface of the quantum dot so allowing for multiple configurations to be explored for fission;

make processing of films much easier as there is no longer a need to engineer an organic-inorganic interface assembly. The organic-inorganic interface assembly can be constructed before the processing of the film and with very good control; and allow for the determination of a minimum number of quantum dots to be used in the film.

The invention claimed is:

1. A photon multiplying material comprising a luminescent material having organic semiconductor molecules capable of singlet fission attached thereto, wherein the organic semiconductor molecules are chemically attached to the luminescent material by a linking group and wherein the linking group and the band gap of the luminescent material are selected so that exciton triplet states formed by singlet fission in the attached organic semiconductor molecules can be energy transferred into the luminescent material, wherein the triplet energy of the organic semiconductor molecule is greater than the band gap of the luminescent material and the triplet energy of the organic semiconductor molecule is within 0.4 eV of the band gap of the luminescent material.

2. The material according to claim 1, wherein the linking group provides that one or more of the attached organic semiconductor molecules are within 2.0 nm or less of the luminescent material.

3. The material according to claim 2, wherein the linking group attaches a single organic semiconductor molecule so that neighbouring semiconductor molecules on the quantum dot are within 2.0 nm or less.

4. The material according to claim 2, wherein the linking group attaches two semiconductor molecules so that each semiconductor molecule is within 2.0 nm or less.

5. The material according to claim 2, wherein the linking group attaches an organic semiconductor molecule which is itself attached to a second organic semiconductor molecule by a further linking group.

6. The material according to claim 1, wherein the linking group comprises one or more a carboxyl (—$CO_2$—), thiocarboxyl (—CSO— or —COS—), amido (—NHO— or —NRO—), amidino (—NHN— or —NRN—), thiocarbamyl (—CSN—), sulphanyl (—S—) and phosphatidyl (—$PO_3$—) moiety.

7. The material according to claim 1, wherein the linking group comprises an acetylene, alkene, thiophene, furan, pyrrole, p-phenylene, oligo(p-phenylene), p-phenylene ethynylene and p-phenylenevinylene.

8. The material according to claim 1, wherein the organic semiconductor molecule is a small molecule, a dimer, an oligomer, a homopolymer, a copolymer, a dendrimer or an organometallic complex.

9. The material according to claim 1, wherein the organic semiconductor molecule comprises one or more of an acene, a perylene, a rylene, a diketopyrrolopyrrole, a fluorene, a carotenoid, or a benzofuran.

10. The material according to claim 1, wherein the semiconductor molecule has a band gap in the range 1.4 to 4.0 eV.

11. The material according to claim 1, wherein the luminescent material comprises an organic transition metal phosphorescent compound, a thermally delayed fluorescent organic compound, an inorganic semiconductor nanoparticle, a 2D-semiconductor or a perovskite material.

12. The material according to claim 1, wherein the luminescent material is a colloidal nanocrystal such as a quantum dot.

13. The material according to claim 12, wherein the quantum dot has a core-shell structure comprising one or more of CdSe, CdS, ZnTe, ZnSe, PbS, PbSe, PbTe, HgS, HgSe, HgTe, HgCdTe, CdTe, alloys of copper zinc tin and sulfur (CZTS), ZnS, $CuInS_2$, alloys of copper indium selenium and sulfur (CISS), $CuGaS_2$, $AgInSe_2$, CuInGaSe, CuInGaS, silicon, InAs, InP, InSb, $SnS_2$, CuS, germanium, and $Fe_2S_3$.

14. The material according to claim 12, wherein the quantum dot has a diameter of 50 nm or less.

15. The material according to claim 1, wherein the band gap of the luminescent material is in the range of 0.6 eV to 2.0 eV.

16. The material according to claim 1, wherein the triplet energy of the organic semiconductor molecule is within 0.3 eV of the band gap of the luminescent material.

17. The material according to claim 1, wherein the triplet energy of the organic semiconductor molecule is within 0.2 eV of the band gap of the luminescent material.

18. The material according to claim 1, wherein the photon multiplication can be excited by illumination with light of wavelength between 300 nm and 600 nm.

19. A photon multiplying film comprising the photon multiplying material according to claim 1.

20. An opto-electronic device comprising a photon multiplying material according to claim 1 in optical communication with an opto-electronic element chosen from the group consisting of a solar cell, a photodetector, a light-emitting diode, a field-effect transistor, a display, a sensor or a biological imaging device.

* * * * *